United States Patent [19]

Hackert et al.

[11] 4,310,805
[45] Jan. 12, 1982

[54] PHASE-LOCKED LOOP STABILIZED BY A CRYSTAL OSCILLATOR

[75] Inventors: William P. Hackert, Schenectady; William C. Hughes, Scotia, both of N.Y.

[73] Assignee: General Electric Company, Schenectady, N.Y.

[21] Appl. No.: 103,032

[22] Filed: Dec. 13, 1979

[51] Int. Cl.$^3$ .................... H03L 7/10; H03L 7/14; H03L 7/18
[52] U.S. Cl. .................... 331/1 A; 331/17; 331/25; 331/DIG. 2
[58] Field of Search .......... 329/50, 122; 331/1 A, 331/17, 18, 21, 25, DIG. 2, 14, 23

[56] References Cited

U.S. PATENT DOCUMENTS

| | | | |
|---|---|---|---|
| 3,448,402 | 6/1969 | Booker, Jr. et al. | 331/21 X |
| 3,706,039 | 12/1972 | Bott | 331/18 X |
| 3,757,244 | 9/1973 | Giger | 329/122 X |
| 3,944,723 | 3/1976 | Fong | 178/3 |
| 3,973,087 | 8/1976 | Fong | 179/170 R |
| 3,973,240 | 8/1976 | Fong | 340/151 |
| 4,007,429 | 2/1977 | Cadalora et al. | 331/17 |
| 4,061,973 | 12/1977 | Reimers et al. | 331/18 X |
| 4,101,834 | 7/1978 | Stutt et al. | 331/1 R X |
| 4,109,204 | 8/1978 | Kincaid et al. | |
| 4,135,181 | 1/1979 | Bogacki et al. | 340/310 A |
| 4,161,720 | 7/1979 | Bogacki | 340/150 |
| 4,205,277 | 5/1980 | Poinas | 331/17 X |

*Primary Examiner*—Siegfried H. Grimm
*Attorney, Agent, or Firm*—Geoffrey H. Krauss; James C. Davis; Marvin Snyder

[57] ABSTRACT

A phase-locked loop circuit, having an oscillator controlled by a voltage related to the phase difference between a reference signal and a loop signal, is stabilized by a crystal oscillator. The voltage controlled oscillator signal is frequency-subtracted from the crystal oscillator signal frequency to provide an input signal to a frequency-arithmetic synthesizer which provides a loop signal to the phase detector for comparison with the coming reference signal. Use of a frequency-adder circuit between the voltage controlled oscillator and the frequency-subtractor, and receiving an addition frequency derived from the frequency-arithmetic synthesizing circuit, is utilized to decrease the loop gain and provide enhanced characteristics.

14 Claims, 4 Drawing Figures

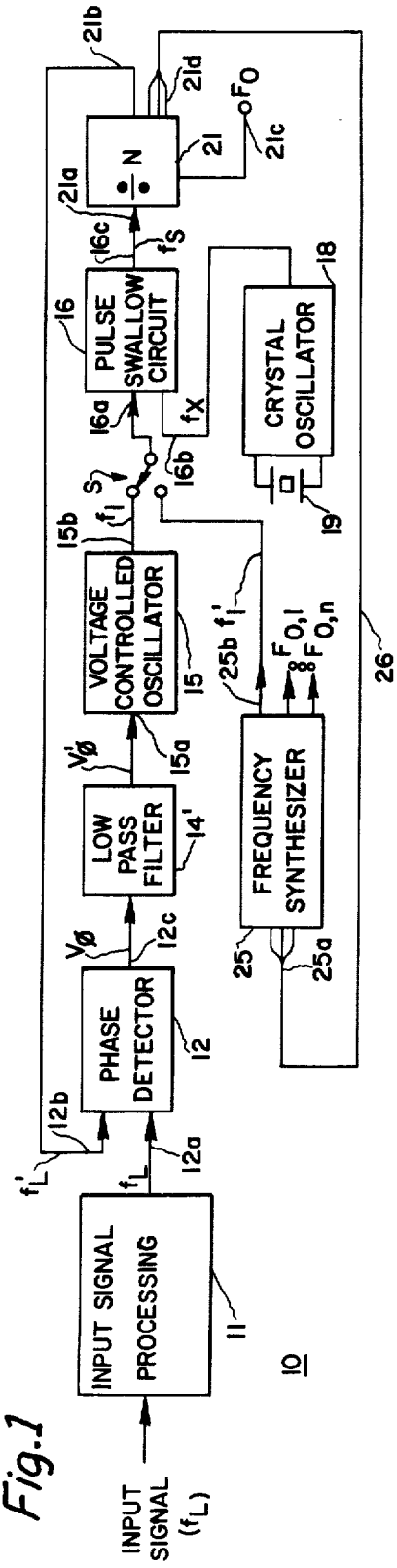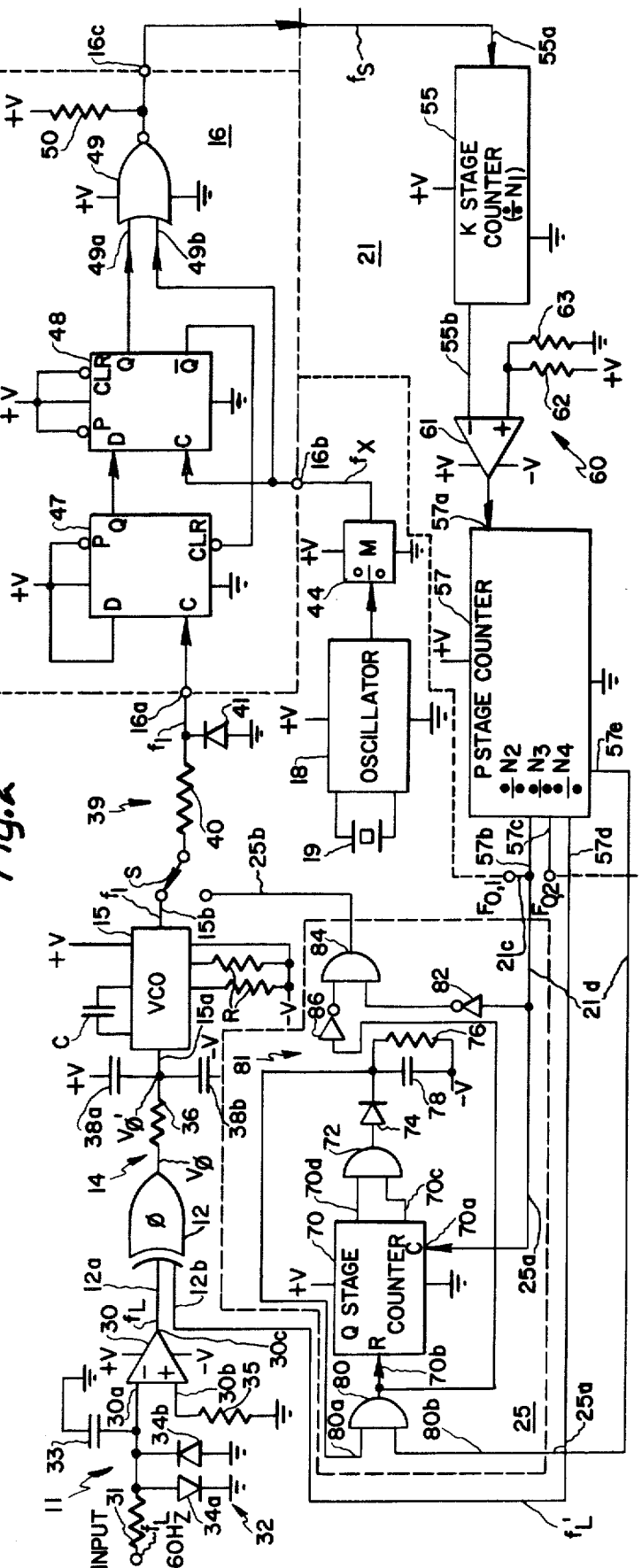

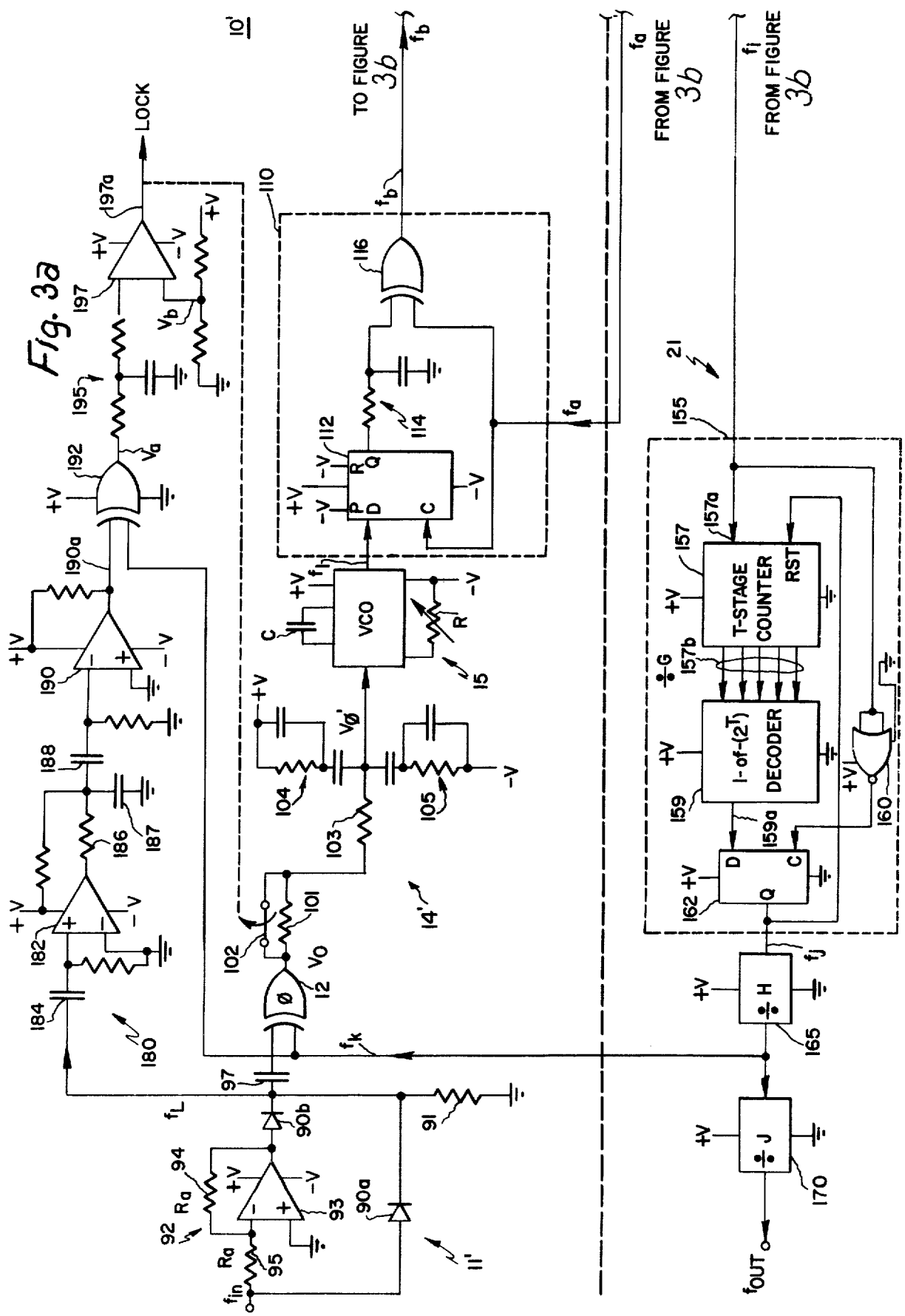

PHASE-LOCKED LOOP STABILIZED BY A CRYSTAL OSCILLATOR

BACKGROUND OF THE INVENTION

The present invention relates to stable frequency generation apparatus, and, more particularly, to a novel phase-locked loop circuit which is stabilized by a crystal oscillator.

It is known that information may be transmitted over power lines between a central facility and a multiplicity of remote locations, each tied to the power distribution network. Power line communications systems of this type are disclosed and claimed in U.S. Pat. Nos. 3,973,240, issued Aug. 3, 1976; 3,973,087, issued Aug. 3, 1976; 3,944,723, issued Mar. 16, 1976; 4,135,181, issued Jan. 16, 1979; and 4,161,720, issued July 17, 1979, all assigned to the assignee of the present application and all incorporated herein in their entirety by reference.

It is also known that the signal-to-noise ratio of the received signal can be greatly improved if the frequencies at which the signals are transmitted are odd multiples of the first sub-harmonic of the power line frequency (typically 60 Hertz (Hz.) in the United States). Improvements in interference suppression are described and claimed in U.S. Pat. Nos. 4,101,834, issued July 18, 1978, and 4,109,204, issued Aug. 22, 1978, both assigned to the assignee of the present application and incorporated herein in their entirety by reference. In power line communication systems where the transmitting carrier frequency is locked to the power line frequency utilizing a phase-locked loop, it is often difficult to meet the stringent requirements of such systems. Typically, these requirements are for each unit in the system to generate at least one frequency, typically in the range of 5-30 kHz., which must be kept locked to the powerline frequency, as the latter frequency changes over a range from about 59.9 Hz. to about 60.1 Hz., and over a range of environmental conditions typically including a −40° C. to +85° C. temperature range, with 35 1% power supply voltage variation. The power supply voltage variation may in fact be a step function, when a communications unit transmitter is keyed. Nevertheless, it is required that the communications transmitter maintain an output frequency, and the associated communications receiver recover a transmitted carrier at that frequency, which is within 1 Hz. of the correct frequency over the entire range of environmental conditions. Further, there is frequently a high noise level present on the powerline, so that units at various locations, where the noise characteristics may be different, must maintain the desired frequency and do so with a relationship that tracks the instantaneous frequency of the powerline. Finally, the highly stable frequencies must be generated by apparatus which is of relatively low cost, especially if such apparatus is to be installed at the location of each power user (each residence and business) on the power distribution grid.

BRIEF SUMMARY OF THE INVENTION

In accordance with the invention, a phase-locked loop is stabilized by a crystal oscillator. The phase-locked loop includes circuitry for processing an incoming signal to provide a reference frequency signal to a phase detector. The phase detector output is filtered and applied to the controlling input of a voltage controlled oscillator which produces a first frequency. The voltage controlled oscillator frequency is frequency-subtracted from the crystal oscillator frequency to provide the input signal for a frequency-arithmetic synthesizing means, containing frequency-addition, frequency-subtraction and frequency-division means, to derive a loop frequency for return to the phase detector, to lock the loop.

In one presently preferred embodiment, the frequency-subtractor circuit is a pulse-swallow frequency counter circuit. In this embodiment, the frequency of the loop is locked to a powerline frequency. Means may be provided to derive a frequency, equal to the nominal frequency of the voltage control oscillator, from the frequency-arithmetic synthesizer means itself, whereby the loop produces the nominal output frequency even if an input signal is not present.

In another preferred embodiment, wherein the reference frequency is derived from a modulated received carrier frequency, input signal processing means are utilized to remove the modulation from the received carrier. A frequency adder is further utilized between the voltage controlled oscillator and the frequency-subtraction circuit to provide decreased loop gain, and enhance stability; the frequency for addition to the output frequency of the voltage controlled oscillator is derived from the frequency-arithmatic synthesizer means itself.

Accordingly, it is an object of the present invention to provide a novel crystal-oscillator-stabilized phase-locked loop.

This and other objects of the present invention will become apparent upon consideration of the following detailed description, when taken in conjunction with the drawings.

BRIEF DESCRIPTION OF THE DRAWINGS

FIG. 1 is a block diagram of a crystal-oscillator-stabilized phase-locked loop in accordance with the present invention;

FIG. 2 is a more detailed schematic diagram of the phase-locked loop of FIG. 1; and FIGS. 3a and 3b are interrelated portions of a schematic diagram of another embodiment of crystal-oscillator-stablized phase-locked loop, in accordance with the principles of the present invention.

DETAILED DESCRIPTION OF THE INVENTION

Figure 3B:
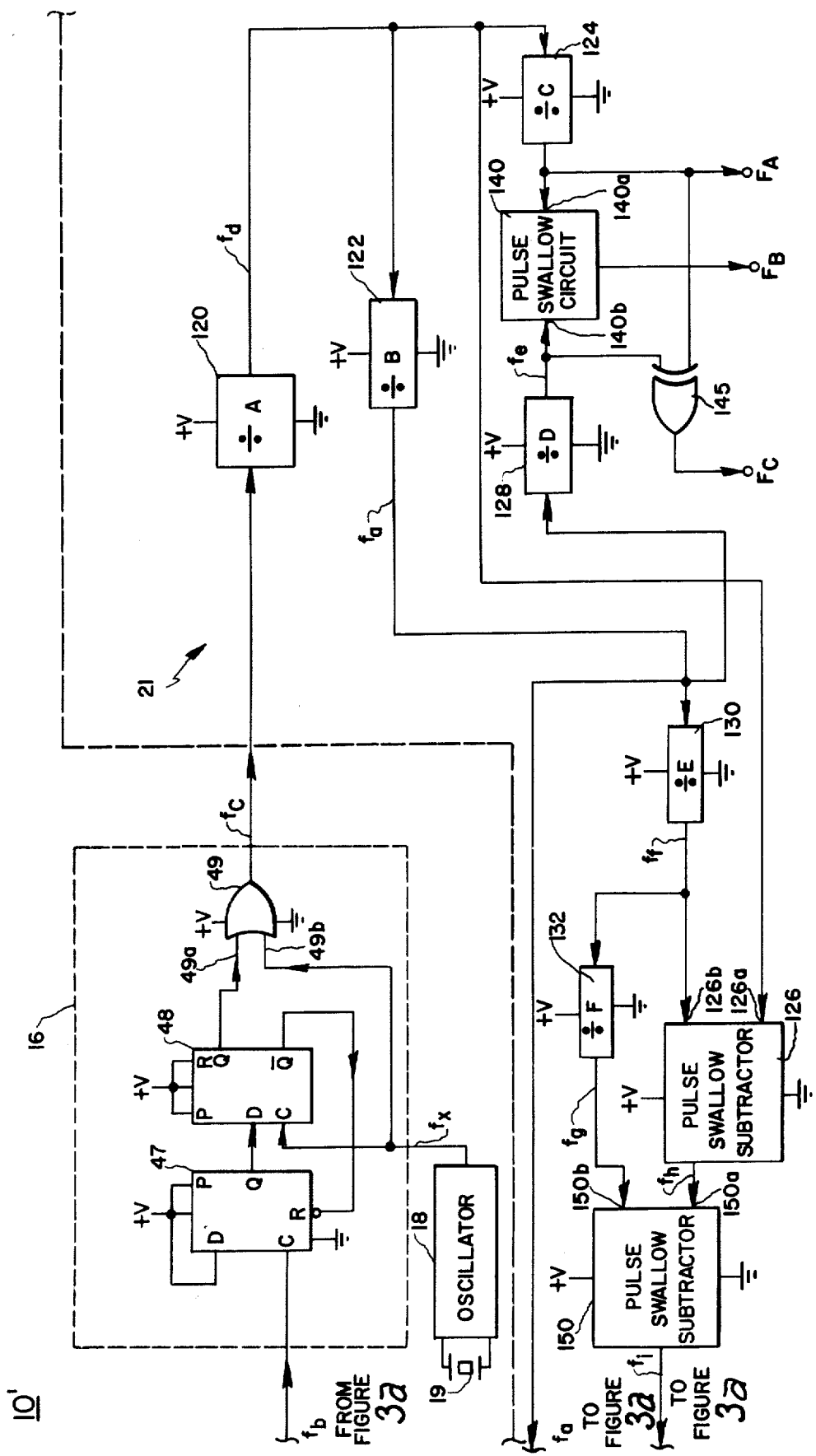

Prior art apparatus typically produces a frequency, locked to the powerline frequency of approximately 60 Hz., by comparing the line frequency, in a phase detector, to a frequency near 60 Hz., produced by countdown circuitry following a voltage controlled oscillator. A difference in frequency between the powerline frequency and the counted-down oscillator frequency produces a phase detector output which is utilized to control the oscillator frequency, resulting in a closed-loop-servo producing a frequency which is a multiple of the 60 Hz. line frequency. Because the powerline frequency can change over the small range of 59.9 Hz. to 60.1 Hz., a loop filter (utilized between the phase detector and the voltage controlled oscillator) must have an extremely long time constant. The resulting capture range of the phase-locked loop is accordingly very small. The integrated circuit phase detectors commonly available for use in low-cost phase-locked loop applications will work over the −40° C. to +85° C. temperature range only if special temperature compensation cicuitry (which is itself quite expensive) is utilized. Further, the low-cost phase detector integrated circuits do not provide the necessary degree of power supply rejection, whereby the power supply voltage variations normally encountered in this type of system tend to produce a transient frequency disturbance; especially-designed phase detector and phase-locked loop integrated circuits can provide the power supply variation rejection required, but these integrated circuits are extremely expensive and are thus precluded from use in large-volume, low-cost circuits.

Referring now to FIG. 1, one presently preferred embodiment of a novel phase-locked loop 10 produces an output signal at each of n output frequencies $f_{o,1}$.—$f_{o,n}$, where n is an integer, which frequencies are each a chosen multiple of the frequency $f_L$ of an input signal. The input signal is processed by input signal processing means 11 and is applied as a reference frequency $f_L$ signal to a first input 12a of a phase detector 12. The phase detector has a second input 12b receiving another signal at approximatey the same frequency $f_L'$, derived from the phase-locked loop. Phase detector 12 detects, in known manner, the difference in phase of the signals at inputs 12a and 12b to provide a votage $V_\phi$ at a phase detector output 12c. The phase detector output voltage passes through a low pass filter 14 and is applied as a control voltage $V_\phi'$ to the control voltage input 15a of a voltage controlled oscillator 15. A signal at an output 15b of the voltage controlled oscillator has a frequency $f_1$ controlled by the magnitude of control voltage $V_\phi'$. The voltage controlled oscillator (VC0) output is applied to a first input 16a of a frequency-difference mixing circuit 16, e.g. a pulse swallow circuit. A second input 16b of the pulse swallow circuit receives a signal from the output of a crystal oscillator 18, at a frequency $f_x$ established by oscillator crystal 19. Pulse swallow circuit 16, in a manner to be described hereinafter, produces a signal at pulse swallow circuit output 16c which is the difference between the frequency ($f_x$) at second input 16b and the frequency ($f_1$) at first input 16a. Thus, the output frequency $f_S$ at pulse swallow circuit output 16c is $f_S = f_x - f_1$. It should be understood that a frequency adder can also be used for circuit 16, to provide a signal of frequency $f_S = f_x + f_1$ if desired. The output of pulse swallow circuit 16 is connected to the input 21a of a divider means 21, which divides the pulse swallow circuit output frequency $f_S$ by an integer N to produce a signal at a first output 21b at the frequency $f_L'$, for coupling back to phase detector second input 12b. The divide-by-N means 21 may have a second output 21c at which a signal at the desired output frequency $F_0$ is available or the output frequency $F_0$ may be taken from another point in the loop, such as the output of pulse swallow circuit 16 (if the output frequency $F_0$ is selected to be the swallow circuit output frequency $f_s$) or the VCO output 15b (if output frequency $F_0$ is selected to be the VCO output frequency $f_1$).

Crystal oscillator 18 operates at a relatively high frequency which, when divided down by the selected factor N, produces a frequency ($f_x$/N) greater than the highest input frequency $f_L$ ever expected to occur. The VCO output frequency $f_1$ is a much lower frequency than the crystal oscillator frequency $f_x$ (typically being less than 10% of the crystal oscillator frequency), so that the pulse-swallow circuit output frequency $f_S$, which is the difference between the crystal oscillator and VCO frequencies, will still be, after division by the factor N, a frequency approximating that of the input signal. The VCO output signal frequency $f_1$ is adjusted by the phase detector output voltage $V_\phi$ to vary the frequency $f_S$ of the difference signal which is divided to be locked to the input frequency.

In the event that an input signal is not present, due to any of a number of possible reasons, a frequency synthesizing means 25 may be utilized to generate the proper pulse-swallow-circuit first input frequency $f_1'$. Frequency synthesizer input 25a receives at least one frequency from a frequency-divider means output 21d, over at least one input line 26 to produce a signal of synthesized frequency $f_1'$, which is coupled to pulse-swallow-circuit first input 16a when a switch means S is operated to connect a frequency synthesizer output 25b to pulse swallower input 16a, in lieu of VCO output 15b. It should be understood that frequency synthesizer means 25 is a passive synthesizer, in the sense that additional oscillators are not utilized therein, and uses only circuitry performing the frequency-arithmetic operations of frequency-addition, frequency-subtraction, frequency-multiplication and frequency-division, on the frequencies of the signals present at frequency synthesizer input 25a. The sole oscillatory means of apparatus 10 are the single voltage-controlled oscillator 15 and crystal oscillator 18.

Shown in FIG. 2 is a presently preferred embodiment of a crystal-oscillator-stabilized phase-locked loop 10. The input signal, if present, is the nominal powerline frequency of 60 Hz., with a range of ±0.1 Hz. Input signal processing means 11 receives the sinusoidal 60 Hz. signal and acts as a zero crossing detector, producing a digital signal at the powerline frequency $f_L$. The zero crossing detector includes an operational amplifier 30 connected to positive and negative operating potentials of magnitude ±V (e.g. ±5 volts). An inverting input 30a of the operational amplifier is connected via a resistance 31 to at least a portion of the powerline voltage, and to a transient-suppressing means 32, such as a shunt capacitance 33 and a pair of back-to-back clipping diodes 34a and 34b, connected to ground potential. The non-inverting operational amplifier input 30b is connected to ground potential via a resistance 35 of magnitude substantially equal to the resistance magnitude of resistor 31. Due to the lack of feedback from operational amplifier output 30c to either of the operational amplifier inputs, amplifier 30 acts as a threshold detector providing an output signal approximating a square wave of frequency $f_L$ and alternating between the supply voltage levels of about +V and about −V volts. This reference signal is applied to the first input 12a of the phase detector, which is an exclusive-OR gate. The output of the exclusive-OR gate phase detector is fed through low pass filter 14, which includes a series resistance 36 connected to the frequency control input 15a of VCO 15, and a pair of loop filter capacitances 38a and 38b, of substantially equal value and each connected between an associated one of the opposite-polarity, substantially-equal voltage sources (of magnitude ±V) and VCO input 15a. The low pass filter thus formed filters phase detector output voltage $V_\phi$ and provides the filtered voltage $V_\phi'$ to control the VCO. VCO 15 may be part of an integrated circuit, such as the CMOS integrated circuit type 4046, which includes both phase detector 12 and VCO 15. The VCO receives the opposite-polarity operating potentials ±V and is configured with a frequency establishing capacitance C and a pair of frequency-determining resistances, which may be of equal magnitude R, connected thereto. The values of resistances R and capacitance C are chosen to establish a desired free-running VCO output frequency with a zero volt signal at control input 15a. The output of VCO 15 is a squarewave symmetrical about zero volts, and is passed through a negative clipper 39, comprising a resistance 40 and a clipper diode 41, to remove the negative voltage excursions of the output signal before applying the VCO output signal to pulse-swallow-circuit 16, configured in TTL logic. Oscillator 18, having its frequency determined by crystal element 19, operates at a relatively high frequency and may have its output frequency divided by suitable frequency-division means 44, before application to pulse-swallow-circuit second input 16b.

The pulse-swallow circuit comprises a pair of D-type flip-flops 47 and 48, and a NOR gate 49. The flip-flops (connected between the positive operating and ground potentials), have preset (P) and clear (CLR) inputs, as provided by a standard 5474 TTL integrated circuit. First flip-flop 47 has its clock (C) input connected to first pulse-swallow-input 16a and has its data (D) input connected to the positive operating potential, along with the preset P input. The CLR input of flip-flop 47 is connected to a Q output of second flip-flop 48. The Q output of flip-flop 47 is connected to the D input of flip-flop 48, which latter flip-flop has its P and CLR inputs connected to the positive operating potential. The Q output of flip-flop 48 is connected to one input 49a of the NOR gate, while the remaining NOR gate input 49b is connected to the clock C input of second flip-flop 48, and forms the second pulse-swallow-circuit input 16b. The NOR gate output, which may be connected (as required) to the positive operating potential via a pull-up resistor 50, forms the pulse-swallow-circuit output 16c. Circuit 16 operates as a subtraction circuit whereby, for each positive transition at first input 16a, one positive transition of the signal at second input 16b is eliminated from the waveshape at output 16c.

As an example, and without limitation of the general applicability of our novel crystal-oscillator-stablized phase-locked loop, a pair of output frequencies $F_{0,1}$ and $F_{0,2}$ are to be generated having nominal frequencies of 61,440 Hz. and 30,720 Hz., respectively, and having actual frequencies respectively exactly equal to 1024 times and 512 times the actual frequency of the nominal 60 Hz. line frequency at the loop input. Oscillator 18 is a highly stable, temperature-compensated oscillator at 16 MHz., and means 44 is a divide-by-two circuit, whereby the frequency $f_x$ at pulse-swallow-circuit input 16b is 8.000 MHz. We have chosen the VCO to have an output frequency $f_1$ of 135,680 Hz. with a zero volt control signal (representative of the input signal being at a line frequency of 60.0 Hz.) and with the VCO having output frequencies of about 122,573 Hz. and about 148,787 Hz. for respective line frequency inputs of 60.1 Hz. and 59.9 Hz. Thus, with a 60.0 Hz. input line frequency and zero volt control voltage $V_\phi'$, pulse-swallow-circuit receives a 8,000,000 Hz. signal at input 16b and a 135,680 Hz. signal at input 16a, to produce an output 16c signal having a frequency $f_S$ of 7,864,320 Hz. Divider means 21 must divide this last frequency by a factor of 128 ($=2^7$) to derive the 61,440 Hz. output frequency; further divide by another factor of 2 to derive the 30,720 Hz. output frequency; and then divide by an additional factor of 512 times ($=2^9$) to provide a 60 Hz. signal at output 21b for connection back to phase detector input 12b.

Frequency divider 21 includes a first frequency division means 55, which may be a K-stage ripple counter having an input 55a receiving the pulse-swallow-circuit output 16c signal, and having an output 55b at which appears a signal having a frequency less than the frequency $f_S$ by a factor $N_1$. In the illustrated embodiment, $N_1 = 8 = 2^3$, whereby $K = 3$ and first divider means 55 is a three-stage ripple counter, such as may be found in a portion of a standard 5493A TTL-type integrated circuit. The frequency at first divider means output 55b is 983,040 Hz., in the illustrated embodiment. A second divider means 57 is utilized to further divide the frequency of the first divider means output signal. In the illustrated embodiment, second divider means 57 further divides by a factor $N_2$ to provide a first desired signal output 57b at a frequency $F_{0,1}$; divides by an additional factor $N_3$ to provide the second desired signal output 57c at its associated frequency $F_{0,2}$; and finally divides by a third factor $N_4$ to provide a signal output 57d of frequency $f_L'$ fed back to second phase detector input 12b. We have deliberately established other conditions in a powerline communications system to require signals which are exact multiples of 60 Hz., whereby, in the illustrated embodiment, $N_2 = 16 = (2^4)$; $N_3 = 2$; and $N_4 = 512 = (2^9)$. Thus, second divider means 57 is a P-stage ripple counter, with $P = 4 + 1 + 9 = 14$ binary division stages. Advantageously, a 14 stage binary ripple counter is available in a standard CMOS 4060 integrated circuit; an additional divide-by-two means can be utilized to provide a signal at the first subharmonic of the line frequency, e.g. at $(60/2) = 30$ Hz., which signal tracks the line frequency; the 30 Hz. signal may be used to synthesize the transmitter carrier, at an odd multiple of the line frequency subharmonic.

A level conversion means 60, comprising an operational amplifier 61 (coupled between the positive and negative supply potentials) and a voltage divider including resistances 62 and 63 connected to the inverting input of the operational amplifier, are used to translate the logic signals, from the output 55b of the TTL-logic first divider means 55, to appropriate logic levels for reception by the input 57a of the CMOS-logic second divider means 57. The first desired frequency output signal appears at a first output 57b, at the output of the fourth of the fourteen counter stages, while the second desired frequency output signal appears at another output 57c at the fifth stage of the fourteen stage ripple counter. Similarly, the desired approximately-sixty-cycle output appears at a third output 57d at the last divider stage, i.e. at the fourteenth stage of the fourteen stage counter. This nominal 60 Hz. frequency is applied to the phase detector 12, which produces an output waveform having a D.C. content proportional to the phase difference between the two signals at inputs 12a and 12b. If the two frequencies are in phase quadrature, the D.C. voltage is zero and no change occurs in the VCO output frequency $f_1$. If the line frequency $f_L$ is greater than the divider output frequency $f_L'$, as by the line frequency increasing towards its 60.1 Hz. upper limit, the phase detector output voltage $V_\phi$ becomes increasingly negative, reducing the VCO output frequency $f_1$ to reduce the number of counts subtracted from the crystal oscillator frequency $f_x$, and thereby increasing the frequency $f_S$ out of the pulse-swallow-circuit and the following frequency divider 21. Similarly, if the line frequency is decreased towards its lower limit of 59.9 Hz., the phase detector output voltage $V_\phi$ becomes more positive and increases the VCO output frequency $f_1$ to increase the number of counts subtracted from the crystal oscillator frequency $f_x$ and therefore decreasing the frequency $f_S$ out of the pulse-swallow-circuit and the following divider 21, to decrease the fed-back frequency $f_L'$, to match the decreased line frequency. It will be seen that, in the illustrated embodiment, frequency divider 21 divides the pulse-swallow-circuit output frequency by a factor of $8 \times 16,384$ (or $2^3 \times 2^{14} = 2^{17}$). Thus, for a low-line-frequency case, the input frequency is 59.9 Hz., and the divider means input frequency $f_S$ must be $2^{17}$ times greater than the input frequency or 7,851,212.8 Hz. Since the oscillator supplies a constant 8 MHz., the VCO output frequency must be increased to 148,787.2 Hz., responsive to the input magnitude of the control voltage $V_\phi'$. Similarly, when the line reaches its high-frequency limit of 60.1 Hz, the divider means input frequency must be $2^{17}$ times greater than this frequency, or 7,877,427.2 Hz., which requires a VCO output frequency of 122,572.8 Hz. responsive to the decreased magnitude of control voltage $V_\phi'$. In this manner, the desired frequency waveforms at divider outputs 57b and 57c are maintained at an exact integer multiple of the input signal.

As hereinabove explained, a reference frequency input may be occasionally lost. In such instances, switch S is operated (by means not shown) to connect the clamping network resistor 40 to the output 25b of frequency-arithmetic synthesizer 25. Synthesizer 25 need not be present if a reference input frequency is always available. The synthesizer includes, in the illustrated embodiment, a frequency divider means 70 having a clock input 70a, a reset input 70b and, in the illustrated embodiment, two divided-frequency outputs 70c and 70d. A first two-input AND gate 72 has its inputs respectively connected to divider outputs 70c and 70d and has an output connected to the anode of a diode 74. The cathode of diode 74 is connected to one terminal of a parallel resistance 76-capacitance 78 network, returned to negative operating potential $-V$. The cathode of diode 74 is also connected to one input 80a of another two-input AND gate 80. The remaining AND gate input 80b and the Clock input 70a of the frequency divider are the inputs 25a of frequency synthesizer 25, each connected back to an output of frequency divider 21. A first inverter 82 has its input connected to the Clock input 70a of the frequency divider and has its output connected to a first input of a third two-input AND gate 84. The remaining input of AND gate 84 connected to an output of a second logic inverter 86, having its input connected to the output of second AND gate 80.

When use of frequency synthesizer 25 is contemplated, in a crystal-oscillator-stabilized phase-locked loop 10 of the illustration, providing output frequencies of 61,440 Hz. and 30,720 Hz., the oscillator frequency $f_x$ is changed to 7.936 MHz. and the VCO center frequency is changed to 71,680 Hz. The frequencies required at synthesizer input 25a are the 61,440 Hz. output frequency, to Clock input 70a and the input of inverter 82, and a frequency, at AND gate input 80b, of 491,520 Hz. The latter frequency is obtained, at the first stage output 57e in the second frequency divider 57. The Q-stage ripple counter 70 (where Q=7 in the illustrated embodiment, as by use of a CMOS type 4024 integrated circuit) provides outputs 70c and 70d, respectively, at binary subharmonics, e.g. one-half and one-quarter, of the input frequency; combining the binary subharmonics in the network of gate 72, diode 74 and the resistance 76-capacitance 78 allows the counter 70 to be reset once for every desired submultiple, e.g. every sixth cycle of the input frequency (e.g. 61,440 Hz.) and generate a gated subharmonic of that input frequency (e.g. 10,240 Hz.) for coupling into a frequency-adder 81, which is a NAND gate equivalent circuit, comprised of inverters 82 and 86 and gate 84. Thus, it should be understood that frequency divider means 70 need only be a two-stage ripple counter in the illustrated embodiment.

The effect of resetting the counter for every m-th (e.g. sixth) pulse provides an output frequency of ($F_{0,1}$/M), e.g. 10,240 Hz. frequency, as an input to inverter 86. As inverter 82 receives the 61,440 Hz. input frequency, gate 84 acts as a frequency adder, to generate the 71,680 Hz. precise frequency required at input 16a of the pulse-swallow-circuit for maintaining the loop in a high-frequency stability condition. The 71,680 Hz. frequency at synthesizer output 25b is subtracted from the 7.936 MHz. oscillator frequency to generate the 7,864,320 Hz. frequency required at the input of frequency divider 21. In this manner, high stability frequencies are generated at outputs 57b and 57c of divider means 57, even when the loop operates on battery power and does not receive an input signal from the power means.

Referring now to FIGS. 3a and 3b, another embodiment 10' of a crystal-oscillator-controlled phase-locked loop is illustrated. In this embodiment, a constantly-received carrier at some frequency $f_{in}$ (e.g. 5010 Hz.) is used as the reference. The incoming carrier, illustratively, is 180° phase-shift-modulated, whereby the input signal processing means 11' is a full-wave rectifier, utilizing a pair of diodes 90a and 90b, having their cathodes connected to a load resistor 91, and a signal inverter 92, including an operational amplifier 93 having equal resistances $R_a$ connected, as a feedback resistance 94 and an input resistance 95, to the operational amplifier inverting input. The voltage across load 91 is thus at the second harmonic, e.g. 10,020 Hz., of the input frequency $f_{in}$, and has the modulation stripped therefrom for use as the reference signal, at frequency $f_L$, for the loop. This signal is coupled via capacitor 97 to the phase detector, due to the large D.C. component of the rectified carrier. Thus, input signal conditioning means 11' removes the modulation effects by rectification, to prevent the phase-locked loop from attempting to track the modulation of the input carrier and thus become extremely unstable.

The phase detector output voltage $V_\phi$ is passed through a loop filter 14' comprising: a first resistance 101, paralleled by a signal-activatable, normally-closed switch means 102; a series resistance 103; and phasing networks 104 and 105 connected between the loop filter-VCO input and the positive and negative supply potentials. The filtered control voltage $V_\phi'$ controls the instantaneous frequency of VCO 15, which in the illustrated embodiment operates at a nominal frequency $f_1$ of 10,240 Hz.

A frequency adder circuit 110 may follow the VCO to add a selected frequency, which may be derived from the frequency divider 21, to the VCO output frequency to produce the first frequency input to pulse-swallow-circuit 16. In the illustrated embodiment, a frequency $f_a$ (e.g. 61,440 Hz.) is added to the VCO output frequency $f_1$, to provide the first input frequency $f_b$ (e.g. 71,680 Hz.) to the pulse-swallow circuit. Frequency adder 110 comprises a D-type flip-flop 112 having its data D input connected to the VCO output, and its clock C input receiving the $f_a$ frequency from divider 21. Both the preset P and reset R inputs of flip-flop 112 are disabled by connection to the negative supply potential. The flip-flop Q output is connected via a low pass resistance-capacitance network 114 to one input of a two-input exclusive-OR gate 116, having its other input connected to the flip-flop clock input. When the transition of the VCO output occurs at the D input of flip-flop 112, the Q output of the flip-flop makes a similar transition simultaneous with the next positive transition of the Clock input. The Q output transition is delayed by the low pass network 114. As the output of the exclusive-OR gate always transitions when one of its inputs transition, the output of gate 116 will be the sum of the transitions on the two input lines thereof.

The frequency-adder means 110 serves to further decrease the loop gain and thus decrease the phase-locked-loop frequency response to improve the frequency and phase stability of the output frequencies generated by the loop. As the loop reference input frequency $f_{in}$ is continually received and is highly stable in frequency, any changes detected by the loop, except for very low frequency changes at the reference frequency, are due to noise and dictate that the loop should have minimum frequency response; thus, decreasing the loop frequency response with the attendant improvement in frequency and phase stability is an advantage of the use of frequency adder 110 between the VCO and the subsequent pulse-swallow-circuit.

The frequency-adder means output frequency adder $f_b$ is subtracted from the crystal oscillator frequency $f_x$ in pulse-swallower 16, operating as described hereinabove with reference to FIGS. 1 and 2, and the difference frequency $f_c$ at the output of circuit 16 as applied to frequency divider means 21, which generates the required output frequencies, e.g. $F_A$, $F_B$ and $F_C$, as well as the required frequency $f_a$ for the frequency adder circuit and the frequency $f_k$ for the remaining input of phase detector 12, required to lock the loop.

Thus, the oscillator operates at a frequency $f_x$ (e.g. 7.936 MHz.) to produce a lower pulse-swallow circuit output frequency $f_c$ (e.g. 7,864,320 Hz.) which is converted to another frequency $f_k$ (e.g. 10,020 Hz.) for introduction into the phase detector second input.

It should be obvious that input conditioning means 11 or 11' is not needed if an input reference signal will either not be used, or, if used, has the proper frequency, voltage and lack of modulation characteristics required for locking a high-stability loop. Similarly, it should be understood that the clamping network (resistance 40 and diode 41, of FIG. 2), the transition network 60 (of FIG. 2) and similar networks are only necessary if transitions between different types of integrated-circuit logic are utilized. If all logic is of the same family, clamping and transition networks may not be required. Similarly, the specific type and implementation of loop filter 14 is dictated by the specific loop characteristics, such as lock-in range, stability, lock time and the like, desired.

It will be noted that the frequency $f_k$ fed back to phase detector 12 (e.g. 10,020 Hz.) need not be integrally related to the frequency $f_c$ (e.g. 7,864,320 Hz.) input to the frequency "dividing" means 21. Means 21 can contain, in addition to frequency dividers, other frequency-arithmetic logic means, such as frequency-multipliers, frequency-subtractors (similar to pulse-swallow circuit 16) and frequency-adders (similar to frequency adder 110). As an example, in one preferred embodiment, wherein the above-identified input and output frequencies are required to/from means 21, and additional output frequencies $F_A$ (at 491,520 Hz. for a transmitter waveform synthesizer), and $F_B$ and $F_C$ (respectively at 506,880 Hz. and 476,160 Hz. for other use in a receiver) are desired, a particular implementation of means 21 is shown in FIGS. 3a and 3b.

The pulse-swallow circuit ouput frequency $f_c$ is applied to the input of a divide-by-A counter 120; in particular, counter 120 is a divide-by-8 counter formed of a three-stage binary ripple counter, such as a part of a standard TTL 5493 integrated circuit. The output frequency $f_d$ of counter 120 is therefore at 983,040 Hz. and is applied to: the input of a divide-by-B counter 122, the input of a divide-by-C counter 124, and one input 126a of a pulse-swallow circuit 126. Counter 122, in this embodiment, is a divide-by-16 means $(B=16=2^4)$ and produces an output frequency $f_a$ of 61,440 Hz., which is not only the $f_a$ frequency input to frequency input adder 110, but is also made available as an input to a divide-by-D counter 128, and a divide-by-E counter 130. Counter 124 is a divide-by-two means $(C=2=2^1)$ having an output frequency $F_A$ of 491,520 Hz., while counter 128 is a divider-by-4 means $(D=4=2^2)$ with output frequency $f_e$ of 15,360 Hz., and counter 130 is a divide-by-64 means with output frequency $f_f$ of 960 Hz. $(E=64=2^6)$. The output of counter 130 is connected to the other input 126b of pulse-swallow frequency subtractor 126 and to the input of a divide-by-F counter 132, with $F=8=2^3$ and an output frequency $f_g$ of 120 Hz. Counters 122, 124, 128, 130 and 132 are all binary dividers in this illustrated embodiment. A single 14-stage ripple counter, such as the 4020 CMOS integrated circuit, may be used to realize these five blocks in a single chip. In particular, with the 983,040 Hz. signal, from divider means 120, used as an input, the 491,520 Hz. signal for output $F_A$ is obtained at the output of the first ripple counter ($\div 2$) stage; the $f_a$ frequency signal is obtained at the output of the fourth stage (as 983,040 Hz.$\div 2^4=61,440$ Hz.); the $f_e$ frequency signal at the output of means 128 is obtained at the output of the sixth stage (as 983,040 Hz.$\div 2^6=15360$ Hz.); the $f_f$ frequency signal at the output of means 130 is obtained at the output of the tenth stage (as 983,640 Hz.$\div 2^{10}=960$ Hz.) and the $f_g$ frequency signal at the output of means 132 is obtained at the output of the last stage (as 983,040 Hz.$\div 2^{14}=120$ Hz).

A pulse-swallow subtraction circuit 140 is connected to the output of the divider-by-C means 124 and thus has one input signal at the first output frequency $F_A$ of 491,520 Hz. The subtracted-frequency input 140b receives the signal at the output of the divide-by-D means 128, at the frequency $f_e$ of 15,360 Hz., whereby the output of circuit means 140 is the difference between the two frequencies, or the second desired output frequency $F_B$ of 476,160 Hz. Pulse-swallow subtract circuit 140 is implemented similar to pulse-swallow circuit 16, wherein the flip-flops may be 4013 CMOS integrated circuits and the NOR gate may be part of a 4001 CMOS integrated circuit.

A frequency-adder utilizing an exclusive-OR gate 145 (which may be part of a 4070 CMOS integrated circuit) receives the $F_A$ and $f_e$ frequencies to additively generate the third output signal at frequency $F_C$ of 506,880 Hz.

The output signal from pulse-swallow subtractor circuit 126, at a frequency $f_h$ of (983,040 Hz.-960 Hz.=982,080 Hz.) is connected to the first signal input 150a of another pulse-swallow subtractor circuit 150. The output signal of the divide-by-F means 132, at the frequency $f_g$ of 120 Hz., is applied to the subtractor second input 150b. Thus, the output signal from pulse-swallow circuit 150 is at a frequency $f_i$ of 981,960 Hz., and is connected to the input of a divide-by-G means 155. In the illustrated embodiment, means 155 is a divide-by-49 means; it will be noted that this circuit does not divide by a binary number. Non-binary division may be accomplished by use of a T-stage counter means 157 coupled with a one-of-$2^T$ decoder means 159, to provide an output pulse after G input pulses have occurred. In this embodiment, the T-stage counter is a seven-stage binary ripple counter (having a maximum count of $2^T = 2^7 = 128$). The T-stage counter input 157a receives the non-binary divider means input frequency $f_i$ signal, as does the input of an inverter 160 (herein configured of a NOR gate having both inputs tied together). It should be understood that the maximum count to be reached by counter 157 as hereinbelow explained is 49, whereby a six-stage binary ripple counter could be used; however, a common integrated circuit having six binary ripple counting stages is not available, and thus a 4024 CMOS integrated circuit (a seven-stage ripple counter) is utilized. Selected ones of the individual stage outputs 157b are coupled to the inputs of decoder means 159, which is a one-of-sixty four decoder means (such as a 4048 CMOS integrated circuit) to enable the output 159a thereof upon receipt of every 49th pulse at counter input 157a. The decoder means output 159a is coupled to the data input D of a flip-flop 162, having its clock C input coupled to inverter 160, and having its Q output coupled back to a reset RST input of the counter. Thus, when counter 157 has received a total of 49 counts, the inputs of the decoder recognize the associated pattern on the various counter outputs 157b, for this preselected count, and enable the decoder output to provide a logic one level at the data D input of flip-flop 62; at the falling edge of the 49th pulse, the clock C input of flip-flop 162 is enabled, via inverter 160, and the logic one level at the D input enables the Q output of flip-flop 162 to produce a single divider-means output pulse and simultaneously reset counter 157. Thus, a single output pulse, of frequency $f_j = 20,040$ Hz., appears at the output of divider means 155 for every G = 49 input pulses.

The signal at frequency $f_j$ is further divided by a divide-by-H means 165 to produce an output signal having a symmetric waveform and a frequency $f_k$, for application to the phase detector 12. In the illustrated embodiment, divider means 165 is a divide-by-two means (H = 2) and the fed-back loop frequency $f_k$ is 10,020 Hz., at the same frequency as the loop reference signals $f_L$ received by phase detector 12 from input signal processing means 11'. Thus, the loop will lock to the input frequency $f_{in}$. As the input frequency was doubled, to remove modulation effects thereon, a divide-by-J means 170, where J = 2, is utilized to derive a signal having an output frequency $f_{out}$ at 5,010 Hz., the received carrier frequency, for use elsewhere in the carrier receiver, e.g. in a synchronous detector and the like.

The crystal-oscillator-controlled phase-locked loop 10' also includes a loop-lock detector means 180, which includes a first squarer-amplifier stage 182, receiving a signal capacitively coupled, by capacitor 184, from the reference signal output of input signal processing means 11'. The first squarer-amplifier stage 182 output signal is then phase shifted 90° by action of resistor 186 and capacitor 187 and is capacitively coupled, by capacitor 188, to the input of a second amplifier stage 190. The signal at second amplifier stage output 190a is essentially a rectangular waveform having a 90° phase-shift with respect to the loop reference signal across resistor 91. The second amplifier output signal and the fed-back loop signal (from divider means 165) are each connected to one input of a two-input exclusive OR gate 192. Both inputs are at the same frequency, e.g. 10,020 Hz., and the voltage $V_a$ at the output of exclusive -OR gate 192 will have a relatively large D.C. component if the waveforms at frequencies $f_L$ and $f_k$ are in phase-quadrature, indicative of a locked-loop, but will have a relatively small D.C. component if there is a lack of phase-quadrature, indicative of an unlocked loop. Voltage $V_a$ is coupled through a low pass filter 195 to a comparator 197, having a fixed voltage $V_b$ at one input thereof. If the D.C. component of the locked detector output voltage $V_a$ is greater than the reference voltage $V_b$, the output 197a of the comparator goes toward the negative supply potential -V, indicating a loop-lock condition; if voltage $V_a$ is less than the comparison voltage $V_b$, the comparator output 197a is at a positive voltage, indicating that the loop is unlocked. When the loop is locked, i.e. output 197a provides a negative voltage thereat, the negative voltage is utilized to open switch 102, effectively placing resistance 101 in the loop filter, to decrease the loop filter response (with enhanced frequency in-phase loop stability, and noise rejection) after loop-lock-up has been achieved.

While several presently preferred embodiments of our novel crystal-oscillator-stabilized phase-locked loop have been set forth in detail hereinabove, many modifications and variations will now become apparent to those skilled in the art. It is our intent, therefore, to be limited only by the scope of the appending claims and not by the specific examples presented herein by way of explanation.

What is claimed is:

1. Apparatus for providing at least one output frequency signal phase-locked to the frequency of an input signal, comprising:

a phase detector having first and second inputs and an output having a signal related to the difference in phase between the signals at the first and second inputs;

input signal conditioning means receiving said input signal for providing a reference frequency signal to said first phase detector input; means connected to the phase detector output for filtering said phase detector output signal;

means receiving the filtered output signal from the filtering means for generating a periodic waveform having a first frequency controlled by the magnitude of the filtered phase detector output signal;

crystal controlled oscillator means for providing a signal at a second frequency;

frequency-subtractive means having a first input receiving a sum-frequency signal and a second input receiving the second frequency signal for providing an output signal having a third frequency equal to the difference between said sum-frequency and second signal frequency;

frequency-arithmetic means receiving the third frequency signal for synthesizing said at least one output signal and for providing a loop signal for coupling to the second input of said phase detector for causing said waveform generating means frequency to vary and lock the frequency of said at least one output frequency to said input signal frequency; said frequency-arithmetic means also providing a signal at a fourth frequency; and means receiving the waveform generating means output signal and said fourth frequency signal for adding the first and fourth frequency signals to provide the sum-frequency input signal to the first input of the frequency-subtractive means.

2. The apparatus of claim 1, wherein said frequency adding means comprises a two-input exclusive-OR gate having said fourth frequency signal coupled to one input thereof and having said waveform generating means output signal coupled to the other input thereof, said gate having an output at which a signal having a frequency equal to the sum of the frequencies at the inputs of the gate appears.

3. The apparatus of claim 2, further comprising a flip-flop logic element having a data input receiving the waveform generating means output signal, a clock input receiving said fourth frequency signal and an output set to the logic state at the data input only when a transition of said fourth signal appears at said clock input, said flip-flop logic element output being coupled to said first input of said exclusive OR gate.

4. The apparatus of claim 1, wherein said frequency-arithmetic means effectively divides said third frequency by a number N, and the second frequency provided by said crystal-controlled oscillator means is chosen to be greater, if effectively divided by N in said frequency arithmetic means, than the greatest expected frequency of said input signal.

5. The apparatus of claim 1, wherein the output signal frequency of said waveform generating means is about one order of magnitude less than said second frequency.

6. The apparatus of claim 1, wherein said frequency-subtractive means comprises a first flip-flop logic element having a count input receiving said first frequency signal, a clear input and an output settable to a first logic level by the appearance of a signal at said count input and to a remaining logic level by the appearance of a signal at said clear input; a second flip-flop logic element having a count input receiving said second frequency signal, a data input connected to the output of said first flip-flop logic element, a first output settable to said first and second logic levels responsive to the appearance of said first and second logic levels at said data input, and a second output, coupled to the clear input of the first flip-flop logic element and having a signal thereat which is the inverse of the signal at the first output of said second flip-flop logic element; and a NOR gate having a first input connected to the first output of said second flip-flop logic element and a second input receiving said second frequency signal, and an output at which said output signal having a frequency equal to the difference between said first and second signal frequencies appears.

7. The apparatus of claim 1, further comprising auxiliary frequency-arithmetic means receiving signal frequencies from said synthesizing frequency-arithmetic means for providing an additional signal at said first frequency; and switch means activated to connect the first frequency receiving input of said frequency subtractive means to the output of said additional frequency-arithmetic means whenever said input signal is not present at said apparatus.

8. The apparatus of claim 1, wherein said frequency-arithmetic means comprises at least one counter means dividing the third signal frequency by at least one integer divisor in order to provide each of said at least one output signal and said loop signal.

9. The apparatus of claim 1, further comprising means receiving said reference frequency signal and said loop signal for indicating that a phase-quadrature condition exists therebetween.

10. The apparatus of claim 9 wherein said phase-quadrature means is connected to said filtering means for increasing the degree of filtering applied to said phase detector output signal only when said reference and loop signals are in phase quadrature.

11. The apparatus of claim 1, wherein said input signal is a powerline signal and said input signal conditioning means is a zero crossing detector.

12. The apparatus of claim 1, wherein said input signal is a continuously received phase-shift-modulated signal at a carrier frequency; and said input signal conditioning means comprises full-wave rectifying means for providing said reference signal frequency at the second harmonic of the input carrier frequency and devoid of modulation characteristics.

13. Apparatus for providing at least one output frequency signal phase-locked to the frequency of an input signal, comprising:

a phase detector having first and second inputs and an output having a signal related to the difference in phase between the signals at the first and second inputs;

input signal conditioning means receiving said input signal for providing a reference frequency signal to said first phase detector input; means connected to the phase detector output for filtering said phase detector output signal;

means receiving the filtered output signal from the filtering means for generating a periodic waveform having a first frequency controlled by the magnitude of the filtered phase detector output signal;

crystal controlled oscillator means for providing a signal at a second frequency;

means having a first input receiving the first frequency signal and a second input receiving the second frequency signal for providing an output signal having a third frequency equal to difference between said first and second signal frequencies and comprising: a first flip-flop logic element having a count input receiving said first frequency signal, a clear input and an output settable to a first logic level by the appearance of a signal at said count input and to a remaining logic level by the appearance of a signal at said clear input; a second flip-flop logic element having a count input receiving said second frequency signal, a data input connected to the output of said first flip-flop logic element, a first output settable to said first and second logic levels responsive to the appearance of said first and second logic levels at said data input, and a second output, coupled to the clear input of the first flip-flop logic element and having a signal thereat which is the inverse of the signal at the first output of said second flip-flop logic element; and a NOR gate having a first input connected to the first output of said second flip-flop logic element and a second input receiving said second frequency signal, and an output at which said output signal having a frequency equal to the difference between said first and second signal frequencies appears; and frequency-arithmetic means receiving the third frequency signal for synthesizing said at least one output signal and for providing a loop signal for coupling to the second input of said phase detector for causing said waveform generating means frequency to vary and lock the frequency of said at least one output frequency to said input signal frequency.

14. Apparatus for providing at least one output frequency signal phase-locked to the frequency of an input signal, comprising:

a phase detector having first and second inputs and an output having a signal related to the difference in phase between the signals at the first and second inputs;

input signal conditioning means receiving said input signal for providing a reference frequency signal to said first phase detector input; means connected to the phase detector output for filtering said phase detector output signal;

means receiving the filtered output signal from the filtering means for generating a periodic waveform having a first frequency controlled by the magnitude of the filtered phase detector output signal;

crystal controlled oscillator means for providing a signal at a second frequency;

means having a first input receiving the first frequency signal and a second input receiving the second frequency signal for providing an output signal having a third frequency equal to one of the sum and difference between said first and second signal frequencies;

frequency-arithmetic means receiving the third frequency signal for synthesizing said at least one output signal and for providing a loop signal for coupling to the second input of said phase detector for causing said waveform generating means frequency to vary and lock the frequency of said at least one output frequency to said input signal frequency;

auxiliary frequency-arithmetic means receiving signal frequencies from said synthesizing frequency-arithmetic means for providing an additional signal at said first frequency; and switch means activated to connect the first frequency receiving input of said third frequency providing means to the output of said additional frequent-arithmetic means whenever said input signal is not present at said apparatus.

* * * * *